United States Patent [19]

Asakura et al.

[11] Patent Number: 5,014,241
[45] Date of Patent: May 7, 1991

[54] DYNAMIC SEMICONDUCTOR MEMORY DEVICE HAVING REDUCED SOFT ERROR RATE

[75] Inventors: Mikio Asakura; Kazuyasu Fujishima; Yoshio Matsuda, all of Hyogo, Japan

[73] Assignee: Mitsubishi Denki Kabushiki Kaisha, Tokyo, Japan

[21] Appl. No.: 337,219

[22] Filed: Apr. 12, 1989

[30] Foreign Application Priority Data

May 12, 1988 [JP] Japan .................. 63-117707

[51] Int. Cl.⁵ .................. G11C 5/02; G11C 5/06; G11C 7/00
[52] U.S. Cl. .................. 365/51; 365/63; 365/202
[58] Field of Search .................. 365/51, 63, 210, 202

[56] References Cited

U.S. PATENT DOCUMENTS

| | | | |
|---|---|---|---|
| 4,367,540 | 1/1983 | Shimohigashi | 365/63 |
| 4,586,171 | 5/1982 | Fujishima | 365/63 |
| 4,792,928 | 12/1988 | Tobita | 365/202 |
| 4,800,525 | 1/1989 | Shah et al. | 365/51 |
| 4,872,142 | 10/1989 | Hannai | 365/51 |

FOREIGN PATENT DOCUMENTS 5542344 9/1978 Japan .
5942399 12/1979 Japan .

OTHER PUBLICATIONS

T. Yoshira, "A Twisted Bit Line Technique for Multi--Mb Drams", 1988 IEEE International Solid-State Circuits Conference, Digest of Technical Papers (Feb. 19, 1988, pp. 238-239.

Primary Examiner—Terrell W. Fears
Assistant Examiner—Michael A. Whitfield
Attorney, Agent, or Firm—Lowe, Price, Leblanc, Becker & Shur

[57] ABSTRACT

Each of sense amplifiers is coupled to two bit lines with another bit line being interposed therebetween. Information stored in a memory cell is read out onto one of the two bit lines coupled to each of the sense amplifers, while a reference potential is read out onto the other bit line. Outside of the two bit lines, a reference potential is respectively read out onto other bit lines adjacent to the two bit lines. The information stored in the memory cell is read out onto the other bit line between the two bit lines.

12 Claims, 10 Drawing Sheets

DYNAMIC SEMICONDUCTOR MEMORY DEVICE HAVING REDUCED SOFT ERROR RATE

BACKGROUND OF THE INVENTION

1. Field of the Invention

The present invention relates generally to dynamic semiconductor memory devices, and more particularly, to a semiconductor memory device having a reduced soft error rate.

2. Description of the Background Art

Figure 1:
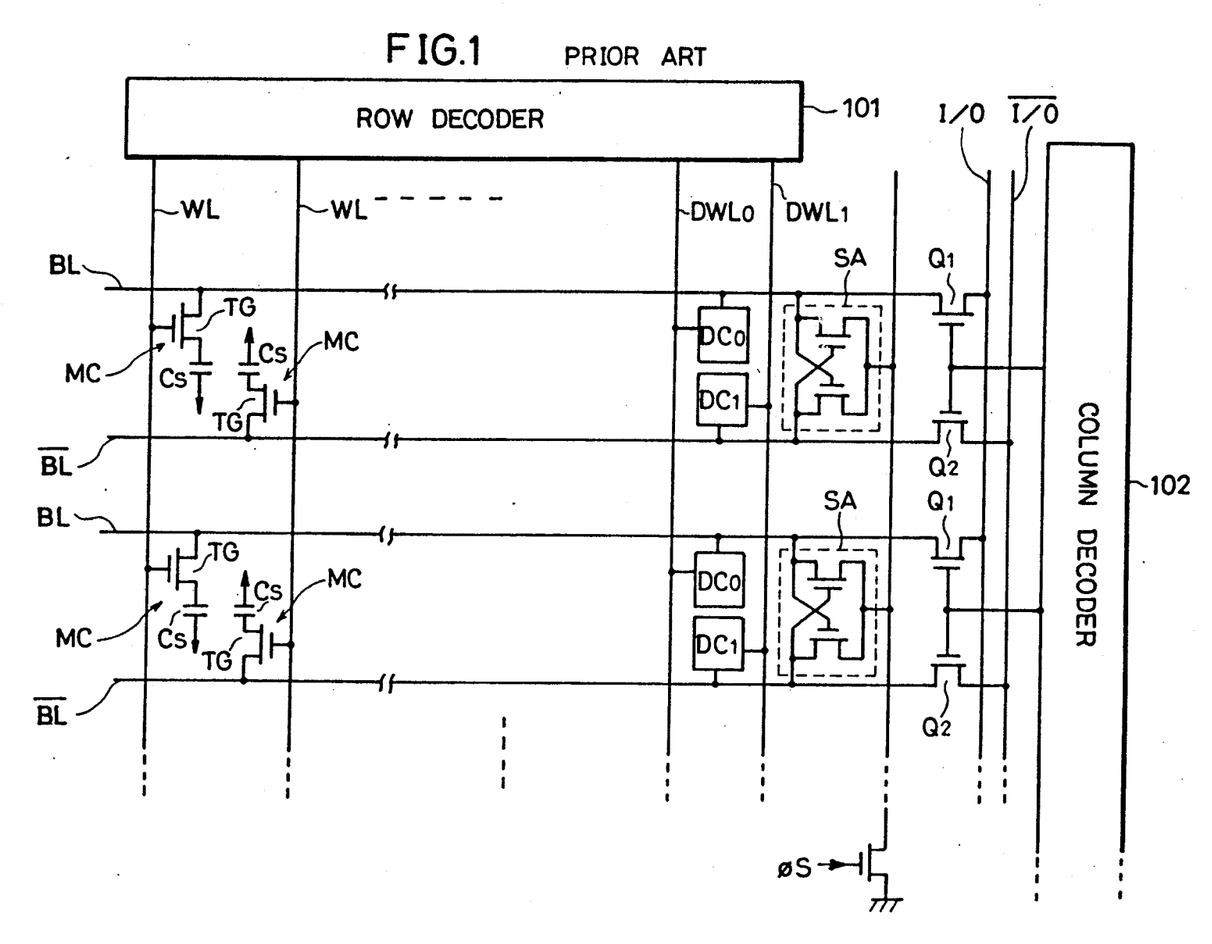
FIG. 1 is a diagram showing e of a main portion of a conventional dynamic random access memory.

FIG. 1 is a diagram showing a structure of a main portion of a conventional dynamic random access memory (referred to as DRAM hereinafter).

In FIG. 1, a plurality of bit line pairs BL and $\overline{BL}$ are arranged intersecting with a plurality of word lines WL. Memory cells MC are respectively connected to intersections of the bit lines BL or $\overline{BL}$ and the word lines WL. Each of the memory cells MC comprises a transfer gate TG comprising an N channel MOS transistor (metal oxide semiconductor) transistor and a capacitance Cs storing "H" or "L" level information. In addition, dummy word lines DWL0 and DWL1 are arranged intersecting with the bit line pairs BL and $\overline{BL}$. Dummy cells DC0 are respectively provided at intersections of the dummy word line DWL0 and the bit lines BL, and dummy cells DC1 are respectively provided at intersections of the dummy word line DWL1 and the bit lines $\overline{BL}$. The dummy cells DC0 and DC1 respectively hold an intermediate potential Vcc/2 between a power-supply potential Vcc and a ground potential.

Additionally, sense amplifiers SA are respectively connected between the bit line pairs BL and $\overline{BL}$. The plurality of word lines WL and the dummy word lines DWL0 and DWL1 are connected to a row decoder 101. The bit line pairs BL and $\overline{BL}$ are respectively connected to a data input/output line pair I/O and $\overline{IO}$ through sets of transfer gates Q1 and Q2 each comprising an N channel MOS transistor. The transfer gates Q1 and Q2 have their gates connected to a column decoder 102.

At the time of data reading, a single word line WL is selected by the row decoder 101, so that a potential thereon is raised to an "H" level. Consequently, data in the memory cell MC connected to the word line WL is read out onto the bit line BL or $\overline{BL}$. For example, when the data is read out onto the bit line BL, a potential on the dummy word line DWL1 is raised to the "H" level, so that a potential of the dummy cell DC1 is read out onto the bit line $\overline{BL}$. Consequently, the potential on the bit line $\overline{BL}$ becomes a reference potential Vref. On the other hand, a potential on the bit line BL becomes slightly higher or lower than the reference potential Vref. Thereafter, a potential difference between the bit line pair BL and $\overline{BL}$ is amplified by the sense amplifier SA. Any one set of the transfer gates Q1 and Q2 is turned on by the column decoder 102, so that the data on the bit line pair BL and $\overline{BL}$ connected thereto is read out onto the data input/output line pair I/O and $\overline{IO}$.

Let's consider a potential which appears on each bit line pair BL and $\overline{BL}$ at the time of data reading.

Figure 2:
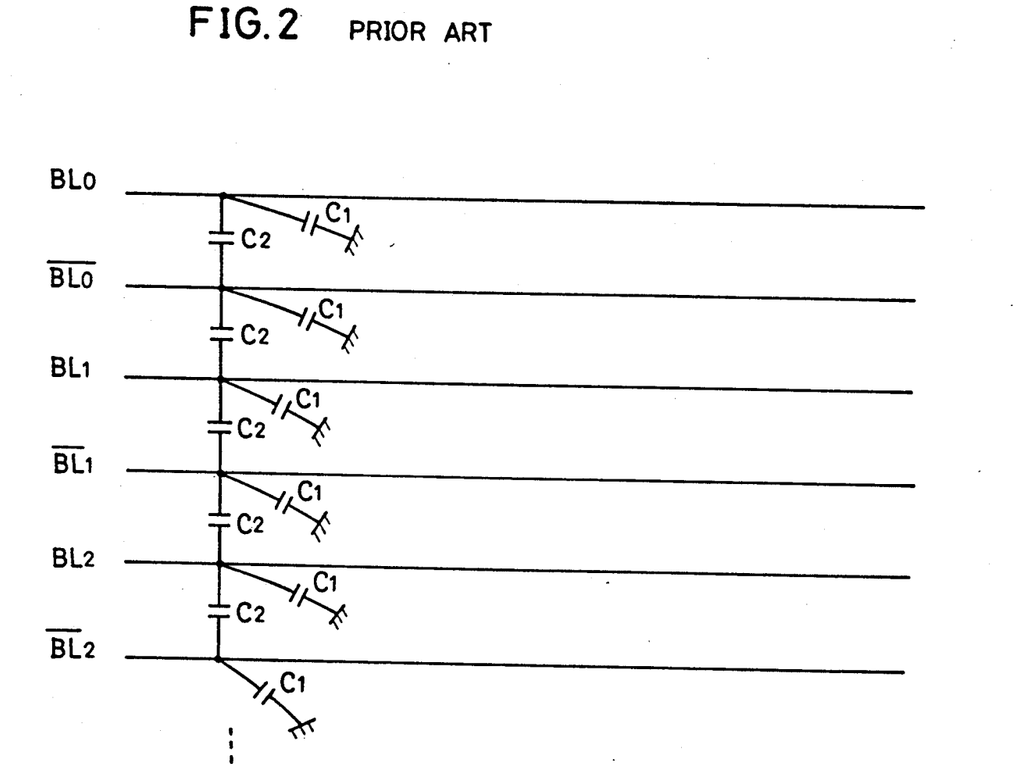
FIG. 2 is a diagram showing a capacitance which exists on each bit line in the conventional dynamic random access memory.

As shown in FIG. 2, it is assumed that a capacitance $C_1$ exists between each of the bit lines BL and $\overline{BL}$ and a ground potential (fixed potential) through a substrate, and a capacitance $C_2$ between bit lines exists between the adjacent bit lines BL and $\overline{BL}$. In addition, it is assumed that a cell capacitance of the memory cell MC is Cs.

Charges stored in the memory cell MC are Cs·Vcc (writing of Vcc) when "H" level data is stored while being 0 (writing of 0V) when "L" level data is stored. In addition, charges of Cs Vcc/2 (writing of Vcc/2) are respectively stored in the dummy cells DC0 and DC1. Assuming that the bit line pair BL and $\overline{BL}$ is precharged at Vcc/2 before a reading operation, charges on the bit lines BL and $\overline{BL}$ are respectively $C_1$ Vcc/2.

In FIG. 2, if and when data is read out onto a bit line BL1 from the memory cell MC and a potential is read out onto a bit line $\overline{BL1}$ from the dummy cell DC, for example, a potential $V_{BL1}$ on the bit line BL1 and a potential $V_{\overline{BL1}}$ on the bit line $\overline{BL1}$ are respectively found from the following equations:

$$C_1 \frac{V_{cc}}{2} + C_s \left( \frac{1}{2} \pm \frac{1}{2} \right) V_{cc} = \tag{1}$$

$$C_1 V_{BL1} + C_2 (V_{BL1} - V_{BL0}) + C_2 (V_{BL1} - V_{\overline{BL1}}) + C_s V_{BL1}$$

(+: at the time of writing of Vcc, -: at the time of writing of 0V)

$$C_1 \frac{V_{cc}}{2} + C_s \frac{V_{cc}}{2} = \tag{2}$$

$$C_1 V_{\overline{BL1}} + C_2 (V_{\overline{BL1}} - V_{BL2}) + C_2 (V_{\overline{BL1}} - V_{BL1}) + C_s V_{\overline{BL1}})$$

Where $V_{\overline{BL0}}$ denotes a potential on a bit line $\overline{BL0}$, and $V_{BL2}$ denotes a potential on a bit line BL2. Let's consider a case in which the "H" data is read out onto the bit lines BL0, BL1 and BL2. In this case, the following relation is satisfied:
$V_{BL0} \approx V_{BL1} \approx V_{BL2}$, $V_{\overline{BL0}} \approx V_{\overline{BL1}} \approx V_{BL2}$
When this relation is substituted in the equations (1) and (2), a potential difference $\Delta V_{BL1}$ ($= V_{BL1} - V_{\overline{BL1}}$) between the bit lines BL1 and $\overline{BL1}$ is represented by the following equation:

$$\Delta V_{BL1} \approx \frac{\frac{1}{2} C_s V_{cc}}{C_1 + 4C_2 + C_s} \tag{3}$$

When integration density of a memory device is increased and a pitch between bit lines is decreased, the capacitance $C_2$ between bit lines is increased, so that the denominator in the equation (3) becomes large. Consequently, the potential difference between the bit line pair BL and $\overline{BL}$ at the time of reading is decreased due to noises of capacitive coupling between the adjacent bit lines, so that a read margin is decreased. As a result, a malfunction of the sense amplifier occurs, so that a soft error rate is increased, for example.

A twisted bit line technique for decreasing noises of capacitive coupling between bit lines by a different method from that in the present invention has been proposed in an article entitled "A Twisted Bit Line Technique for Multi-Mb DRAMS", 1988 IEEE International Solid-State Circuits Conference, DIGEST OF TECHNICAL PAPERS, pp. 238-239.

SUMMARY OF THE INVENTION

An object of the present invention is to provide a dynamic semiconductor memory device having a reduced soft error rate and an operating method therefor.

Another object of the present invention is to provide a dynamic semiconductor memory device in which a read margin is increased and an operating method therefor.

Still another object of the present invention is to provide a dynamic semiconductor memory device in which the degree of the decrease in difference between read potentials due to noises of capacitive coupling between adjacent bit lines is reduced and an operating method therefor.

A further object of the present invention is to provide a dynamic semiconductor memory device in which the effect that one bit line out of two bit lines coupled to each of sense amplifiers is exerted on by another bit line adjacent thereto becomes equal to the effect that the other bit line out of the two bit lines is exerted on by another bit line adjacent thereto.

The dynamic semiconductor memory device according to the present invention comprises a plurality of word lines, a plurality of bit lines, a plurality of memory cells, a plurality of reference potential supplying means, a plurality of sense amplifier means, and switch means. The plurality of bit lines are arranged intersecting with the plurality of word lines. Each of the plurality of memory cells is provided at any one of intersections of the plurality of word lines and the plurality of bit lines. Each of the plurality of reference potential supplying means is used for applying a reference potential to each of the plurality of bit lines. Each of the plurality of sense amplifier means is coupled to one bit line onto which information stored in the memory cell is read out and one bit line to which the reference potential is applied out of the plurality of bit lines, which amplifies a potential difference between the two bit lines.

The switch means causes the plurality of sense amplifier means to be coupled to the corresponding two bit lines such that on one side of one bit line out of the two bit lines, another bit line onto which information stored in the memory cell is read out is adjacent to the one bit line and on the other side of the one bit line, another bit line to which the reference potential is applied is adjacent to the one bit line, and on one side of the other bit line out of the two bit lines, another bit line onto which the same information as said information is read out is adjacent to the other bit line and on the other side of the other bit line, another bit line to which the reference potential is applied is adjacent to the other bit line.

In the semiconductor memory device according to the present invention, on both sides of one bit line out of the two bit lines coupled to each of the sense amplifier means, another bit line onto which information stored in the memory cell is read out and another bit line to which the reference potential is applied are adjacent to the one bit line, and on both sides of the other bit line out of the two bit lines, another bit line onto which the same information as the above described information is read out and another bit line to which the reference potential is applied are adjacent to the other bit line. Thus, noises which the one bit line out of the two bit lines receives from the adjacent bit line through a coupling capacitance between lines become equal to noises which the other bit line out of the two bit lines receives from the adjacent bit line through a capacitive coupling between lines, so that the degree of the decrease in potential difference between the paired bit lines is reduced.

As described in the forgoing, according to the present invention, since the effect that one bit line out of two bit lines coupled to each sense amplifier means is exerted on by another bit line adjacent thereto becomes equal to the effect that the other bit line out of the two bit lines is exerted on by another bit line adjacent thereto, the degree of the decrease in potential difference between the paired bit lines is reduced at the time of data reading, so that a read margin is increased and a soft error rate is improved, for example.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Referring now to the figures, one embodiment of the present invention will be described.

Figure 3:
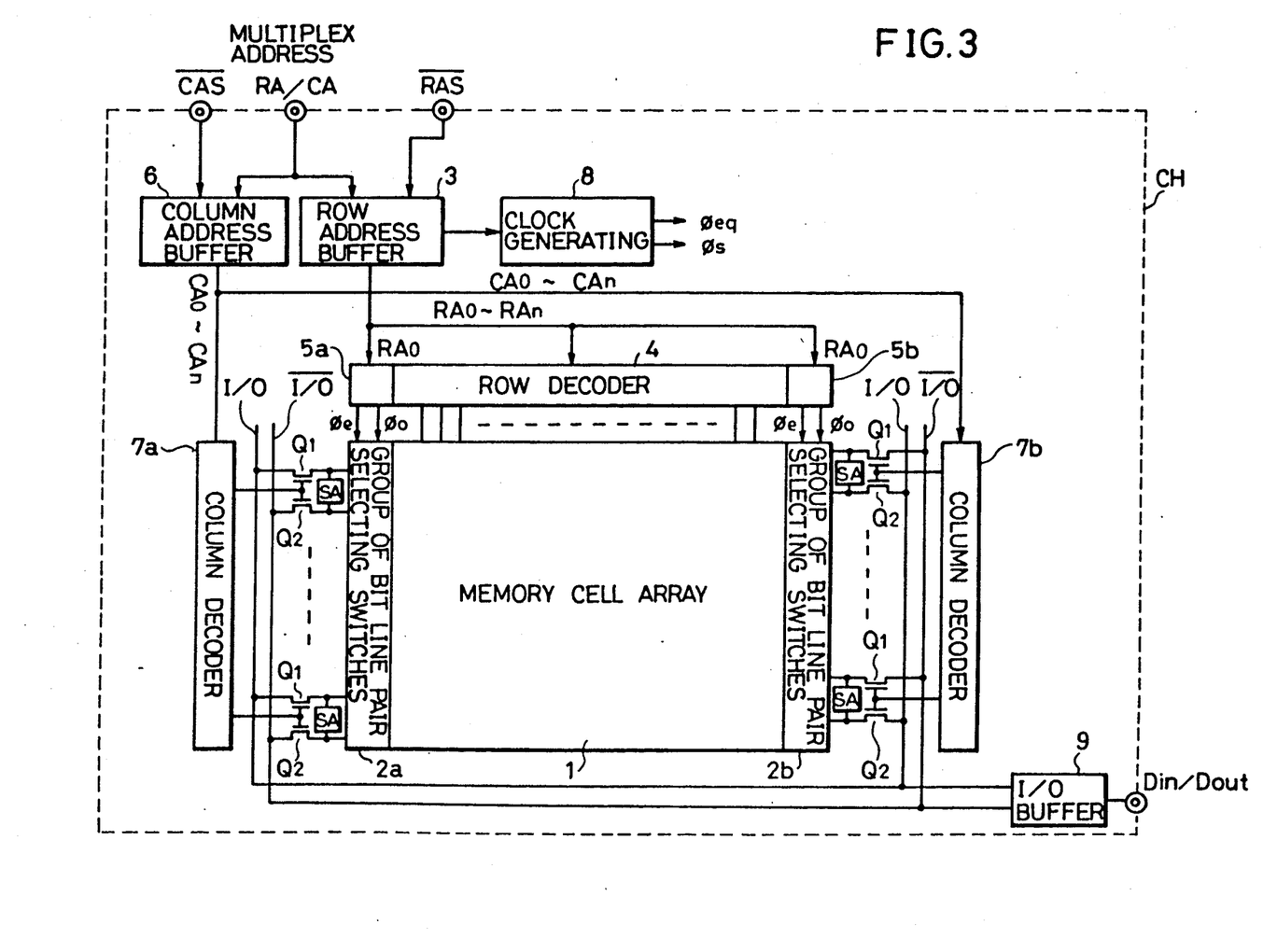
FIG. 3 is a block diagram showing an entire structure of a dynamic random access memory according to one embodiment of the present invention.

FIG. 3 is a block diagram showing an entire structure of a DRAM according to one embodiment of the present invention.

In FIG. 3, a memory cell array 1 comprises a plurality of word lines, a plurality of bit lines intersecting therewith, and a plurality of memory cells respectively provided at intersections thereof, as described below. The plurality of bit lines in the memory cell array 1 are connected to sense amplifiers SA through a group 2a or 2b of bit line pair selecting switches. Each of the sense amplifiers SA is connected to a data input/output line pair I/0 and $\overline{IO}$ through N channel MOS transistors Q1 and Q2.

On the other hand, a row address buffer 3 is responsive to a row address strobe signal $\overline{RAS}$ for applying an externally applied address signal to a row decoder 4 as row address signals $RA_0$ to $RA_n$ and applying a single row L address signal $RA_0$ to selecting signal generating circuits 5a and 5b. The row decoder 4 is responsive to the row address signals $RA_0$ to $RA_n$ for selecting one of word lines included in the memory cell array 1 to raise a potential thereon to an "H+" level. The selecting signal generating circuits 5a and 5b are responsive to the row address signal $RA_0$ for applying a selecting signal $\phi e$ or $\phi o$ to the groups 2a and 2b of bit line pair selecting switches.

Additionally, a column address buffer 6 is responsive to a column address strobe signal $\overline{CAS}$ for applying an externally applied address signal to column decoders 7a and 7b as column address signals $CA_0$ to $CA_n$. The column decoders 7a and 7b are responsive to the column address signals $CA_0$ to $CA_n$ for selecting one set of MOS transistors Q1 and Q2 to apply an "H" level selecting signal to gates thereof. In addition, a clock generating circuit 8 generates clock signals such as an equalize signal $\phi eq$ and a sense amplifier activating signal $\phi s$ to apply the same to the memory cell array 1.

At the time of data reading, data read out from the memory cell array 1 is outputted to the exterior through the data input/output line pairs I/0 and $\overline{IO}$ and an I/O buffer 9 as output data Dout. In addition, at the time of data writing, input data Din is inputted to the memory cell array 1 through the I/O buffer 9 and the data input/output line pairs I/0 and $\overline{IO}$. Meanwhile, each the portions 1 to 9 is formed on a semiconductor chip CH.

Figure 4:
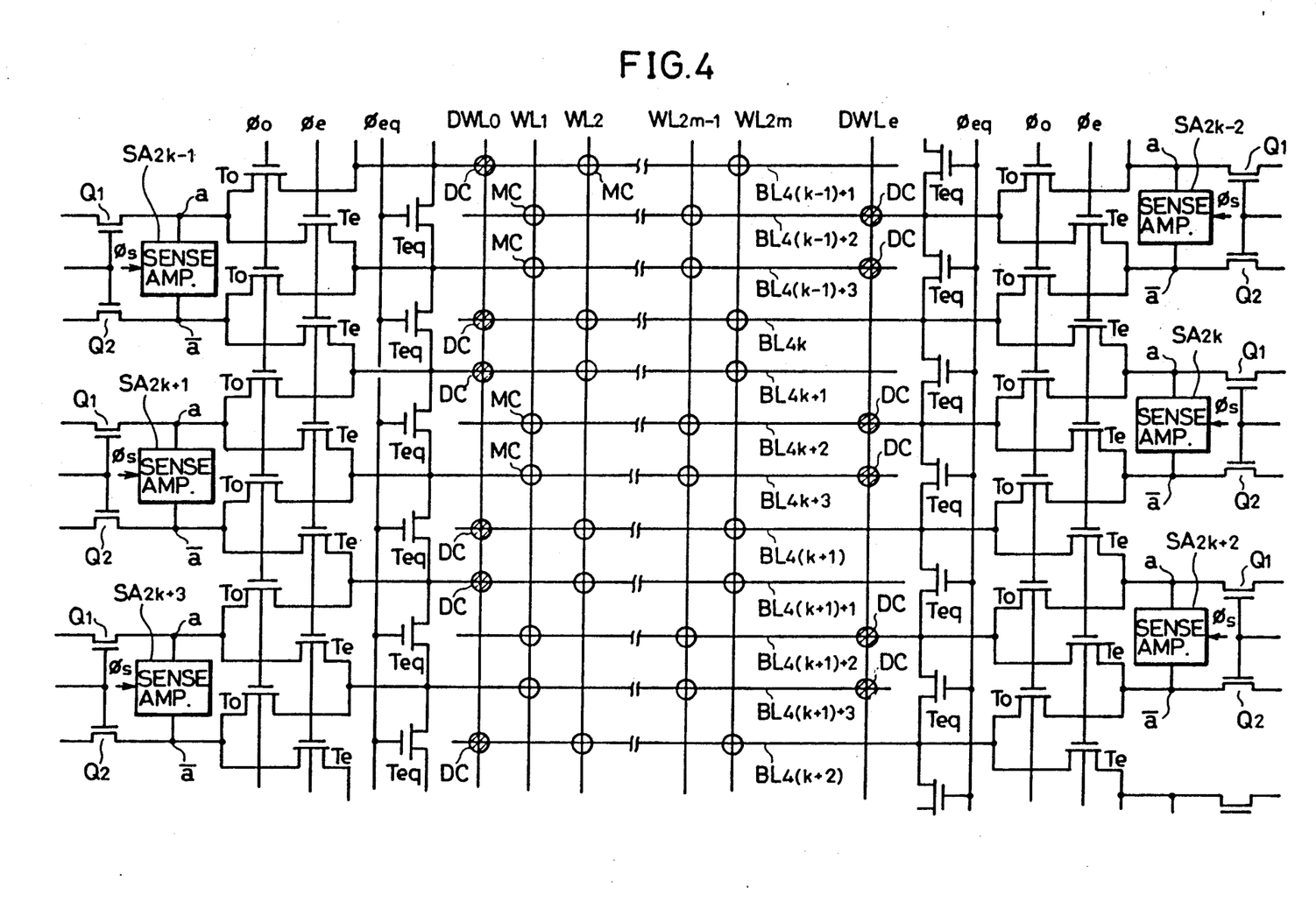
FIG. 4 is a circuit diagram showing a structure of a memory cell array included in the dynamic random access memory shown in FIG. 3.

FIG. 4 is a circuit diagram showing a structure of the memory cell array 1 included in the DRAM shown in FIG. 3.

A plurality of bit lines BL are arranged in the memory cell array 1, and a plurality of word lines WL and dummy word lines $DWL_e$ and $DWL_0$ are arranged intersecting therewith.

Memory cells MC are provided at intersections of an odd-numbered word line $WL_{2m-1}$ and a (4k+2)-th bit line $BL_{4k+2}$ and a (4k+3)-th bit line $BL_{4k+3}$. Memory cells MC are provided at intersections of an even-numbered word line $WL_{2m}$ and a 4k-th bit line $BL_{4k}$ and a (4k+1)-th bit line $BL_{4k+1}$. In addition, dummy cells DC are provided at intersections of a dummy word line $DWL_e$ and the (4k+2)-th bit line $BL_{4k+2}$ and the (4k+3)-th bit line $BL_{4k+3}$. Dummy cells DC are provided at intersections of a dummy word line $DWL_0$ and the 4k-th bit line $BL_{4k}$ and the (4k+1)-th bit line $BL_{4k+1}$. In this case, k is an integer of one or more, and m is a positive integer. The structure of the memory cell MC is the same as that of the memory cell MC shown in FIG. 9. In addition, a potential of Vcc/2 is written in the dummy cell DC.

On the other hand, one terminal a of a 2k-th sense amplifier $SA_{2k}$ shown on the right in FIG. 4 is connected to the 4k-th bit line $BL_{4k}$ through an N channel MOS transistor Te, and connected to the (4k+2)-th bit line $BL_{4k+2}$ through an N channel MOS transistor To. The other terminal $\bar{a}$ of the sense amplifier $SA_{2k}$ is connected to the (4k+2)-th bit line $BL_{4k+2}$ through an N channel MOS transistor Te, and connected to a (4k+4)-th bit line $BL_{4k+4}$ through an N channel MOS transistor $T_0$. In addition, one terminal "a" of a (2k+1)-th sense amplifier $SA_{2k+1}$ shown on the left in FIG. 4 is connected to the (4k+1)-th bit line $BL_{4k+1}$ through an N channel MOS transistor T0, and connected to the (4k+3)-th bit line $BL_{4k+3}$ through an N channel MOS transistor Te. The other terminal $\bar{a}$ of the (2k+1)-th sense amplifier $SA_{2k+1}$ is connected to the (4k+3)-th bit line $BL_{4k}+3$ through an N channel MOS transistor To, and connected to a (4k+5)-th bit line $BL_{4k+5}$ through an N channel MOS transistor Te.

MOS transistors Te and To constitute the group 2a or 2b of bit line pair selecting switches shown in FIG. 3. The MOS transistor Te has its gate receiving a selecting signal $\phi e$ from the selecting signal generating circuits 5a and 5b (see FIG. 3), and the MOS transistor To has its gate receiving a selecting signal $\phi o$ through the selecting signal generating circuits 5a and 5b. When the row address signal $RA_0$ is at the "H" level, the selecting signal $\phi e$ attains the "H" level and the selecting signal $\phi o$ attains the "L" level. On the contrary, when the row address signal $RA_0$ is at the "L" level, the selecting signal $\phi e$ attains the "L" level and the selecting signal $\phi o$ attains the "H" level.

Additionally, N channel MOS transistors Teq for equalizing are respectively connected between the bit lines $BL_{4k}$ and $BL_{4k+2}$ and between the bit line $BL_{4k+1}$ and $BL_{4k+3}$. The MOS transistors Teq have their gates receiving an equalize signal $\phi eq$ from the clock generating circuit (see FIG. 3). Meanwhile, a sense amplifier activating signal $\phi s$ is applied to each of the sense amplifiers $SA_{2k}$ and $SA_{2k+1}$ from the clock generating circuit 8.

Furthermore, the terminals a and $\bar{a}$ of each of the sense amplifiers $SA_{2k}$ and $SA_{2k+1}$ are connected to the data input/output line pair I/O and $\overline{IO}$ (see FIG. 3) through the N channel MOS transistors Q1 and Q2. The MOS transistors Q1 and Q2 have their gates receiving a column selecting signal from the column decoder 7a or 7b.

Referring now to timing charts of FIGS. 5A and 5B, a reading operation of the DRAM shown in FIGS. 3 and 4 will be described.

Figure 5A:
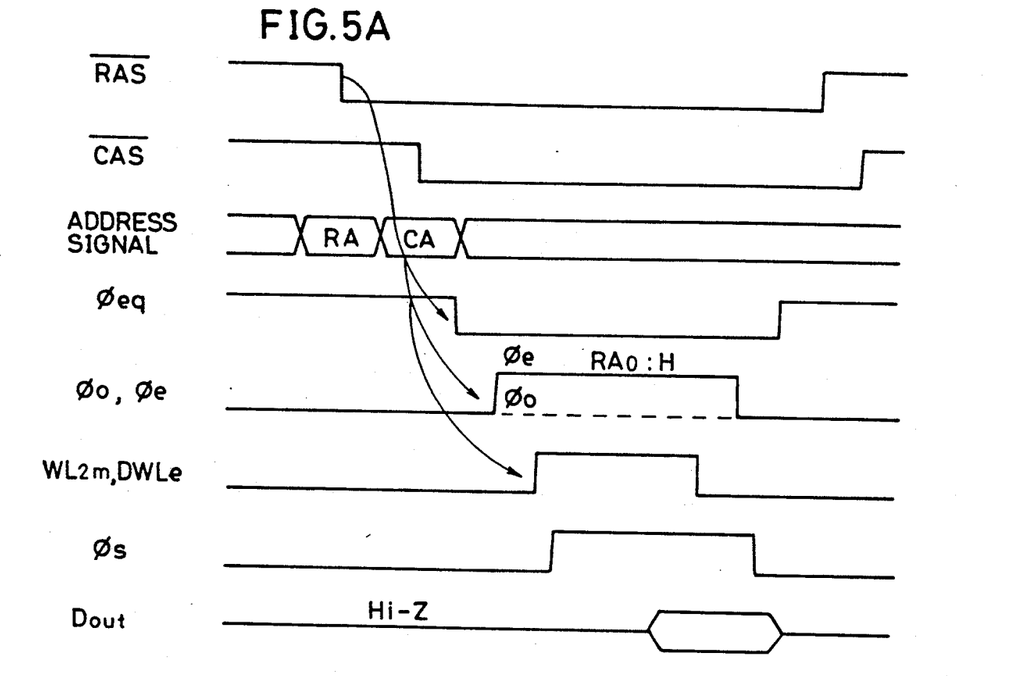
FIG. 5A is a timing chart for explaining a reading operation to occur when an even-numbered word line is selected.
Figure 5B:
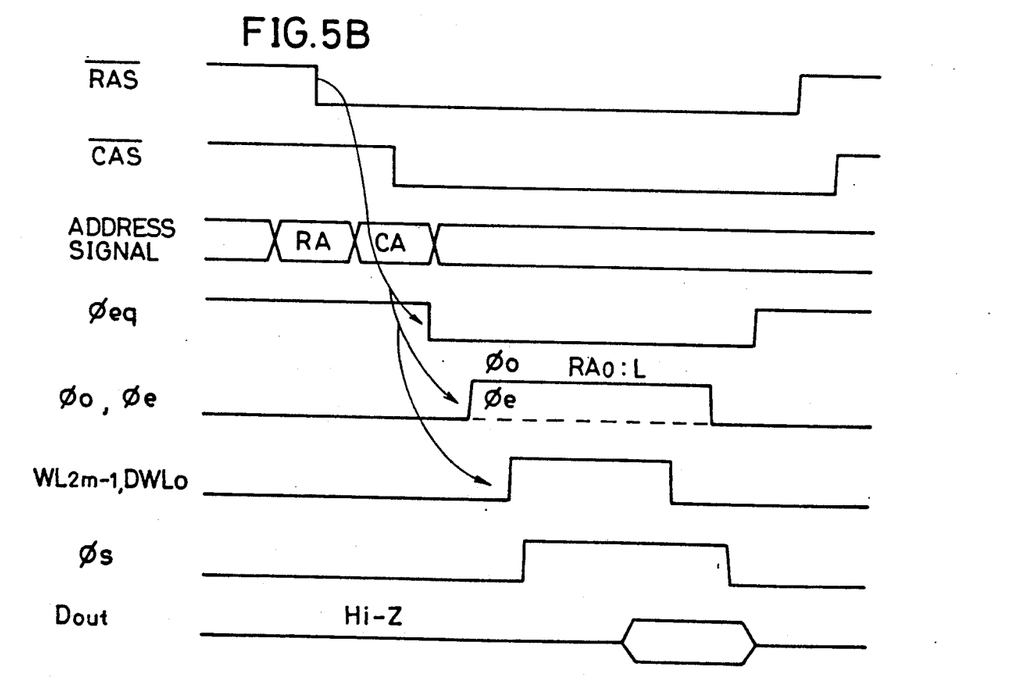
FIG. 5B is a timing chart for explaining a reading operation to occur when an odd-numbered word line is selected.

FIG. 5A shows a reading operation to occur when an even-numbered word line $WL_{2m}$ (m: positive integer) is selected by the row decoder 4, and FIG. 5B shows a reading operation to occur when an odd-numbered word line $WL_{2m-1}$ is selected by the row decoder 4.

Figure 6A:
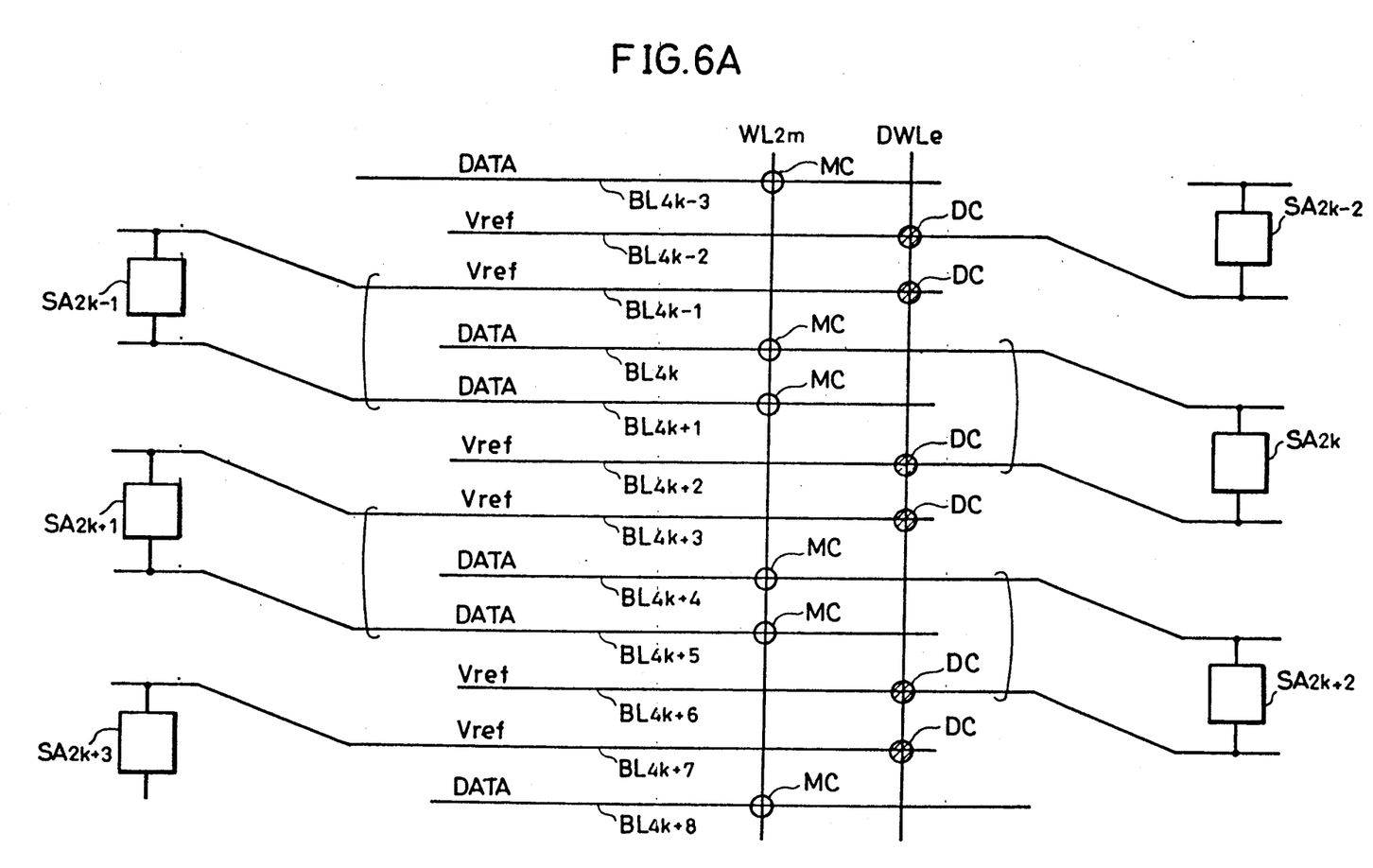
FIG. 6A is a diagram showing an equivalent circuit of a memory cell array in which an even-numbered word line is selected.

Description is now made on an operation to occur when the even-numbered word line $WL_{2m}$ is selected. In FIG. 5A, the equalize signal $\phi eq$ has attained the "H" level in advance, so that the MOS transistors Teq have been turned on. Consequently, the bit lines $BL_{4k}$ and $BL_{4k+2}$ and the bit lines $BL_{4k+1}$ and $BL_{4k+3}$ have been respectively precharged at an equal potential. The row address signals $R_{A0}$ to $RA_n$ are latched in the row address buffer 3 in response to the fall of the row address strobe signal $\overline{RAS}$, and the column address signals $CA_0$ to $CA_n$ are latched in the column address buffer 6 in response to the fall of the column address signal $\overline{CAS}$. Thereafter, the equalize signal $\phi eq$ falls to the "L" level, so that the MOS transistors Teq are turned off. In addition, the selecting signal $\phi e$ rises to the "H" level. On this occasion, the selecting signal $\phi o$ remains at the "L" level. Therefore, in FIG. 4, the transistors Te are turned on and the MOS transistors To remain off. FIG. 6A shows an equivalent circuit of a memory cell array in this case.

As shown in FIG. 6A, a 2k-th sense amplifier $SA_{2k}$ is connected between bit lines $BL_{4k}$ and $BL_{4+2}$, and a $(2k+2)$, and a $(2k+1)$-th sense amplifier $SA_{2k+1}$ is connected between bit lines $BL_{4k+3}$ and $BL_{4k+5}$. More specifically, the bit lines $BL_{4k}$ and $BL_{4k+2}$ are paired with each other, and the bit lines $BL_{4k+3}$ and $BL_{4k+5}$ are paired with each other. Thereafter, potentials on a word line $WL_{2m}$ and a dummy word line $DWL_e$ respectively rise to an "H" level. As a result, data in memory cells MC connected to the word line $WL_{2m}$ are respectively read out onto bit lines, and potentials of dummy cells DC connected to the dummy word line $DWL_e$ are respectively read out onto the bit lines. More specifically, in the bit line pair $BL_{4k}$ and $BL_{4k+2}$, a potential on the bit line $BL_{4k}$ becomes a potential corresponding to the data and a potential on the bit line $BL_{4k+2}$ becomes a reference potential Vref. In addition, in the bit line pair $BL_{4k+3}$ and $BL_{4k+5}$, a potential on the bit line $BL_{4k+3}$ becomes the reference potential Vref and a potential on the bit line $BL_{4k+5}$ becomes a potential corresponding to the data.

Thereafter, the sense amplifier activating signal $\phi s$ rises to the "H" level, so that the sense amplifiers $SA_{2k}$ and $SA_{2k+1}$ (k: integer of 0 or more) are operated. Consequently, a potential difference between the bit lines $BL_{4k}$ and $BL_{4k+2}$ connected to the sense amplifiers $SA_{2k}$ and a potential difference between the bit lines $BL_{4k+3}$ and $BL_{4k+5}$ connected to the sense amplifier $SA_{2k+1}$ are detected and amplified.

Then, a set of the MOS transistors Q1 and Q2 is selected by each of the column decoders 7a and 7b. The MOS transistors Q1 and Q2 have their gates receiving an "H" level column selecting signal. Consequently, the MOS transistors Q1 and Q2 are turned on, so that data amplified by the sense amplifier SA is outputted as output data Dout through the data input/output line pair I/O and $\overline{IO}$ and the I/O buffer 9.

Figure 6B:
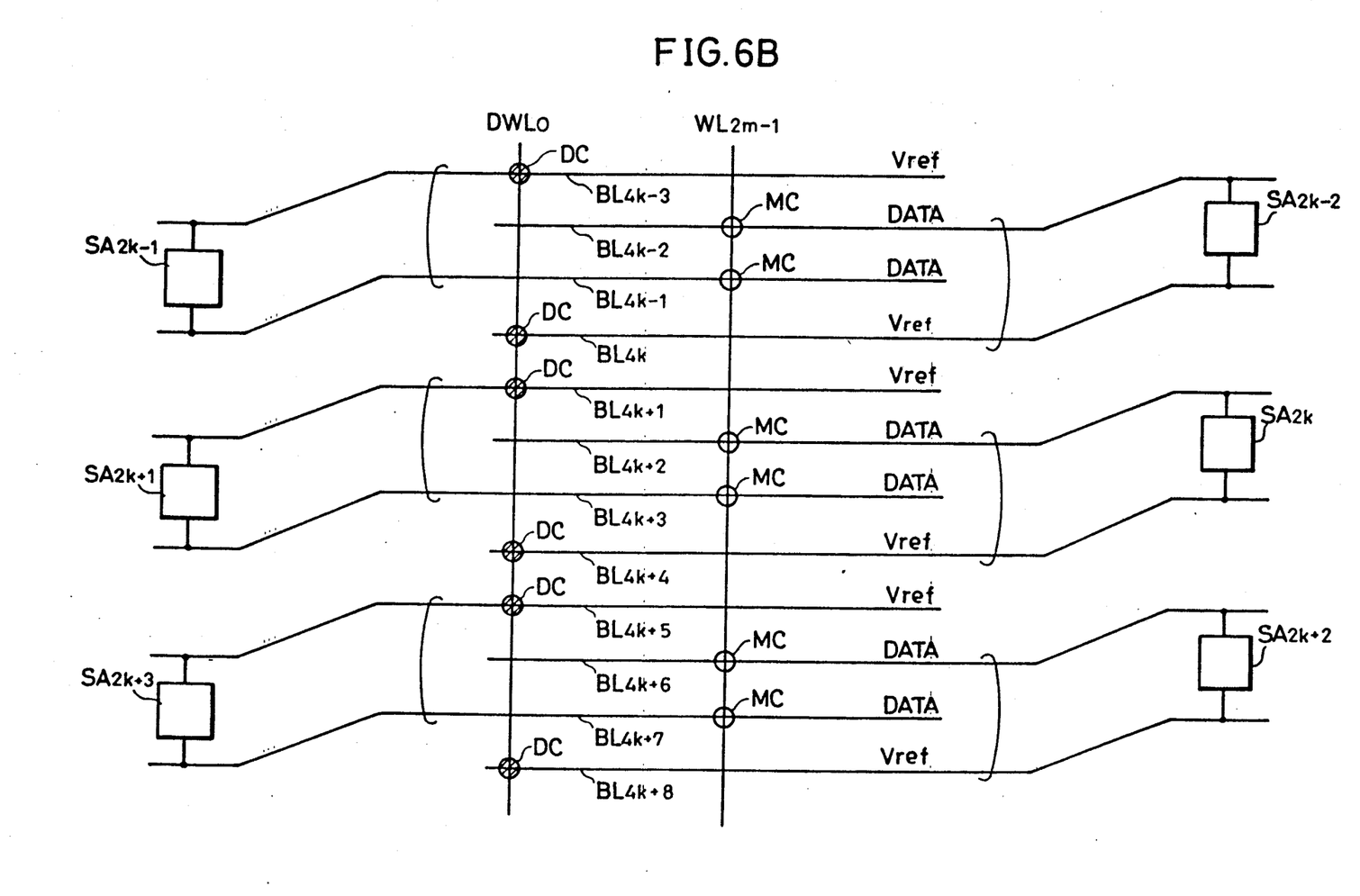
FIG. 6B is a diagram showing an equivalent circuit of a memory cell array in which an odd-numbered word line is selected.

Description is now made on an operation to occur when an odd-numbered word line $WL_{2m+1}$ is selected. In FIG. 3B, the selecting signal $\phi o$ rises to the "H" level after the equalize signal $\phi eq$ falls. On this occasion, the selecting signal $\phi e$ remains at the "L" level. Consequently, the MOS transistors To are turned on and the MOS transistors Te remain off. FIG. 6B shows an equivalent circuit of the memory cell array in this case.

As shown in FIG. 6B, a 2k-th sense amplifier $SA_{2k}$ is connected between bit lines $BL_{4k+2}$ and $BL_{4k+4}$, and a $(2k+1)$-th sense amplifier $SA_{2k+1}$ is connected between bit lines $BL_{4k+1}$ and $BL_{4k+3}$. More specifically, the bit lines $BL_{4k+2}$ and $BL_{4k+4}$ are paired with each other, and the bit lines $BL_{4k+1}$ and $BL_{4k+3}$ are paired with each other. Thereafter, potentials on a word line $WL_{2m-1}$ and a dummy word line $DWL_0$ respectively rise to an "H" level. As a result, data in memory cells MC connected to the word line $WL_{2m-1}$ are read out onto bit lines, and potentials of dummy cells DC connected to the dummy word line $DWL_0$ are read out onto the bit lines. More specifically, in the bit line pair $BL_{4k+2}$ and $BL_{4k+4}$, a potential on the bit line $BL_{4k+2}$ becomes a potential corresponding to the data and a potential on the bit line $BL_{4k+4}$ becomes a reference potential Vref. In addition, in the bit line pair $BL_{4k+1}$ and $BL_{4k+3}$, a potential on the bit line $BL_{4k+1}$ becomes the reference potential Vref and a potential on the bit line $BL_{4k+3}$ becomes a potential corresponding to the data.

Thereafter, the sense amplifier activating signal $\phi s$ rises to the "H" level, so that the sense amplifiers $SA_{2k}$ and $SA_{2k+1}$ are operated. Consequently, a potential difference between the bit lines $BL_{4k+2}$ and $BL_{4k+4}$ connected to the sense amplifier $SA_{2k}$ and a potential difference between the bit lines $BL_{4k+1}$ and $BL_{4k+3}$ connected to the sense amplifier $SA_{2k+1}$ are detected and amplified. The other operation is the same as that described in FIG. 6A.

Figure 7:
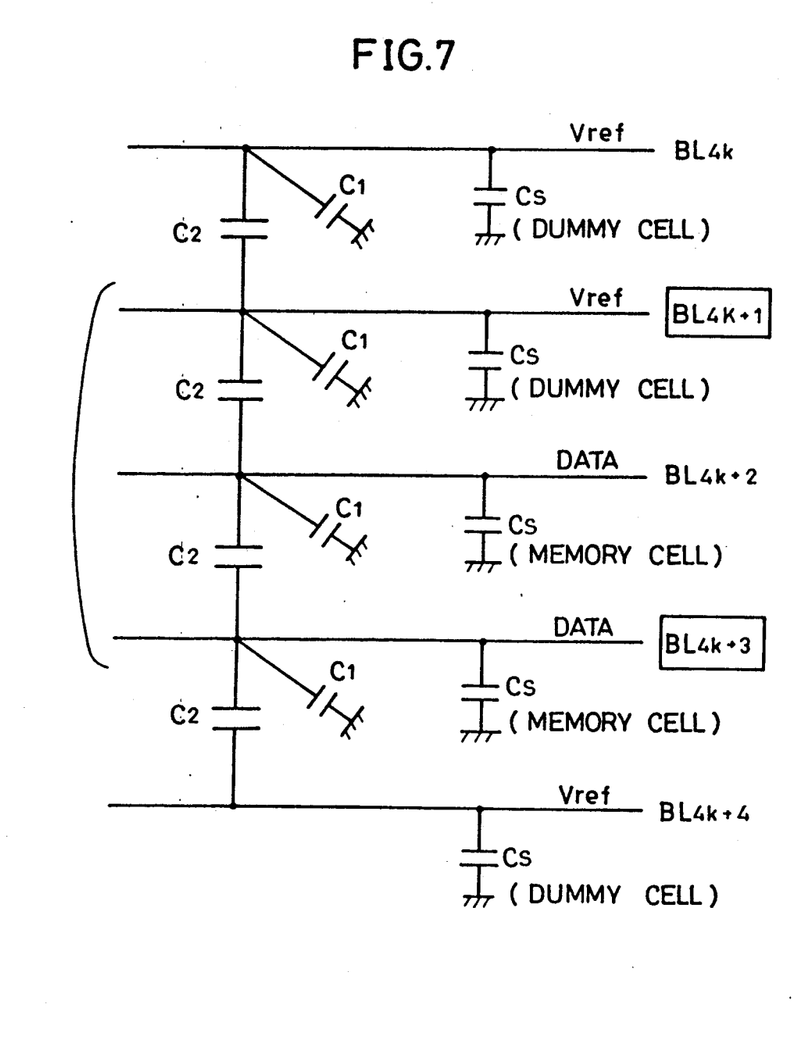
FIG. 7 is a diagram for explaining potentials on paired bit lines time of data reading.

Then, let's calculate a potential difference between bit lines which are paired with each other at the time of data reading. The potential difference between the bit lines $BL_{4k+1}$ and $BL_{4k+3}$ in FIG. 6B will be found herein. FIG. 7 shows an equivalent circuit of the memory cell array in this case.

In FIG. 7, $C_1$ denotes a capacitance which exists between each bit line and a ground potential through a substrate, $C_2$ denotes a capacitance between bit lines, and $C_3$ denotes a cell capacitance of each of memory cells MC or each of dummy cells DC. It is assumed that potentials on bit lines $BL_{4k}$ to $BL_{4k+4}$ are respectively $V_{4k}$ to $V_{4k+4}$, and a precharge level of the bit lines BL is Veq.

With respect to the bit line $BL_{4k+1}$, the following equation holds:

$$C_1 V_{eq} + C_s \left( \frac{1}{2} \pm \frac{1}{2} \right) V_{cc} = \qquad (4)$$

$$C_1 V_{4k+1} + C_2 (V_{4k+1} - V_{4k}) + C_2 (V_{4k+1} - V_{4k+2}) + C_s V_{4k+1}$$

where + shows a case in which "H" level information is written in the memory cell MC (writing of Vcc), and — shows a case in which "L" level information is written in the memory cell MC (writing of 0V).

In addition, with respect to the bit line $BL_{4k+3}$, the following equation holds:

$$C_1 V_{eq} + C_s \frac{V_{cc}}{2} = C_1 V_{4k+3} + C_2 (V_{4k+3} - V_{4k+2}) + \qquad (5)$$

$$C_2 (V_{4k+3} - V_{4k+4}) + C_s V_{4k+3}$$

The left-hand side of the equation (4) shows charges stored in the capacitance $C_1$ and the cell capacitance $C_s$ of the memory cell MC before reading. The right-hand side of the equation (4) shows charges stored in the capacitance $C_1$, the capacitance $C_2$ between bit lines and the cell capacitance $C_s$ of the memory cell MC. In addition, the left-hand side of the equation (5) shows charges stored in the capacitance $C_1$ and the cell capacitance $C_s$ of the dummy cell DC before reading. The right-hand side of the equation (5) shows charges stored in the capacitance $C_1$, the capacitance $C_2$ between bit lines and the cell capacitance $C_s$ of the dummy cell DC after reading.

In this case, since potentials of the dummy cells DC are respectively read out onto the bit lines $BL_{4k}$ and $BL_{4k+4}$, both the potentials become a reference potential Vref. Thus, $V_{4k} \simeq V_{4k+4}$. From the equations (4) and (5), a potential difference $\Delta V$ between the bit lines $BL_{4k+1}$ and $BL_{4k+3}$ is found by the following equation:

$$\Delta V = |V_{4k+1} - V_{4k+3}| \qquad (6)$$

$$= \frac{\frac{1}{2} C_s V_{cc}}{C_1 + 2C_2 + C_s}$$

When the equation (6) is compared with the equation (3) in the conventional DRAM, the coefficient of $C_2$ in the denominator becomes smaller. Thus, the difference $\Delta V$ between read potentials in the DRAM according to the present embodiment becomes larger than that in the conventional DRAM. In addition, the difference $\Delta V$ between potentials read out onto the paired bit lines does not depend on a pattern of potentials read out onto bit lines adjacent thereto.

Figure 8A:
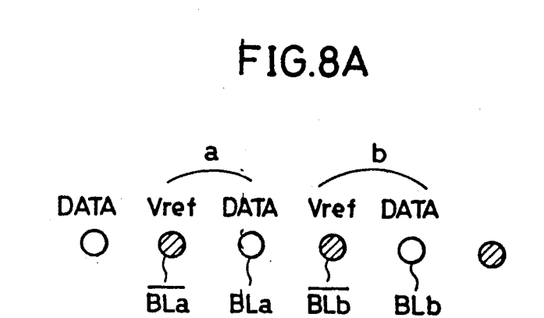
FIG. 8A is a typical diagram for explaining a potential on a bit line at the time of data reading in the conventional dynamic random access memory.
Figure 8B:
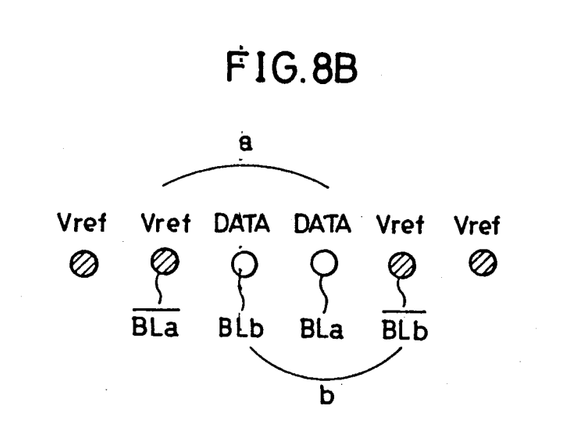
FIG. 8B is a typical diagram for explaining a potential on a bit line at the time of data reading in the dynamic random access memory according to one embodiment of the present invention.

FIG. 8A is a typical diagram showing a potential on a bit line at the time of data reading in the conventional DRAM, and FIG. 8B is a typical diagram showing a potential on a bit line at the time of data reading in the DRAM according to the present embodiment.

In FIGS. 8A and 8B, bit lines BLa and $\overline{BLa}$ are paired with each other, and bit lines BLb and $\overline{BLb}$ are paired with each other. In FIG. 8A, on both sides of the bit line BLa, a reference potential Vref is read out onto bit lines adjacent to the bit line BLa. In addition, a potential corresponding to data is read out onto the bit lines adjacent to the bit line BLa. Therefore, the effect that the bit line BLa is exerted on by bit lines adjacent thereto is different from the effect that the bit line $\overline{BLa}$ is exerted on by bit lines adjacent thereto. Furthermore, the effect that the bit line $\overline{BLa}$ is exerted on by the bit lines adjacent thereto differs depending on the level of the data read out onto the bit lines.

On the contrary, in FIG. 8B, the reference potential Vref is read out in common onto bit lines adjacent to bit lines BLa and $\overline{BLa}$ outside thereof. In addition, a potential corresponding to data is read out onto a bit line between the bit lines BLa and $\overline{BLa}$. Consequently, the effect that the bit line BLa is exerted o by bit lines adjacent thereto becomes entirely equal to the effect that the bit line $\overline{BLa}$ is exerted on by bit lines adjacent thereto. More specifically, noises of capacitive coupling received by the bit line BLa become equal to noises of capacitive coupling received by the bit line $\overline{BLa}$.

As described in the foregoing, there is an advantage that a difference between potentials read out onto the bit line pair in the DRAM according to the present embodiment becomes larger than that in the conventional DRAM, and does not depend on a pattern of data read out onto bit lines adjacent thereto.

Although in FIG. 7, description was made on the potential on a bit line pair connected to the sense amplifier $SA_{2k+1}$ on the left when the odd-numbered word line $WL_{2m-1}$ is selected, it is all the same with the potential on a bit line pair connected to the sense amplifier $SA_{2k}$ on the right. In addition, it is the same with noises which the paired bit line receive from bit lines adjacent thereto when the even-numbered word line $WL_{2m}$ is selected.

Figure 9:
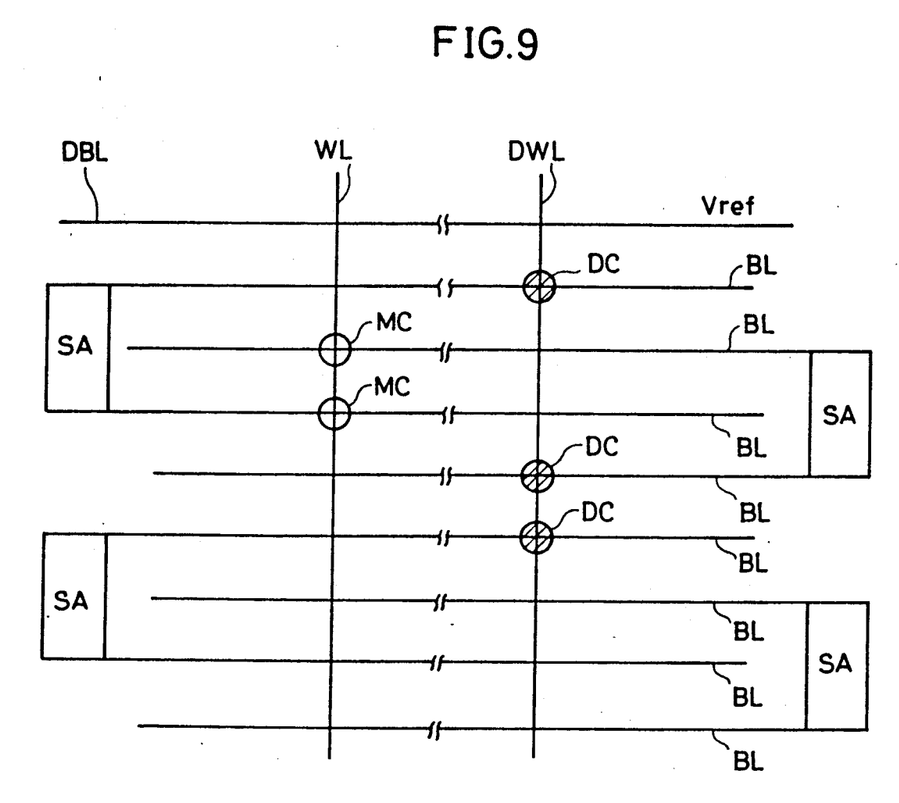
FIG. 9 is a diagram for explaining a structure of the vicinity of the most outside bit line in the dynamic random access memory according to one embodiment of the present invention.
Figure 10:
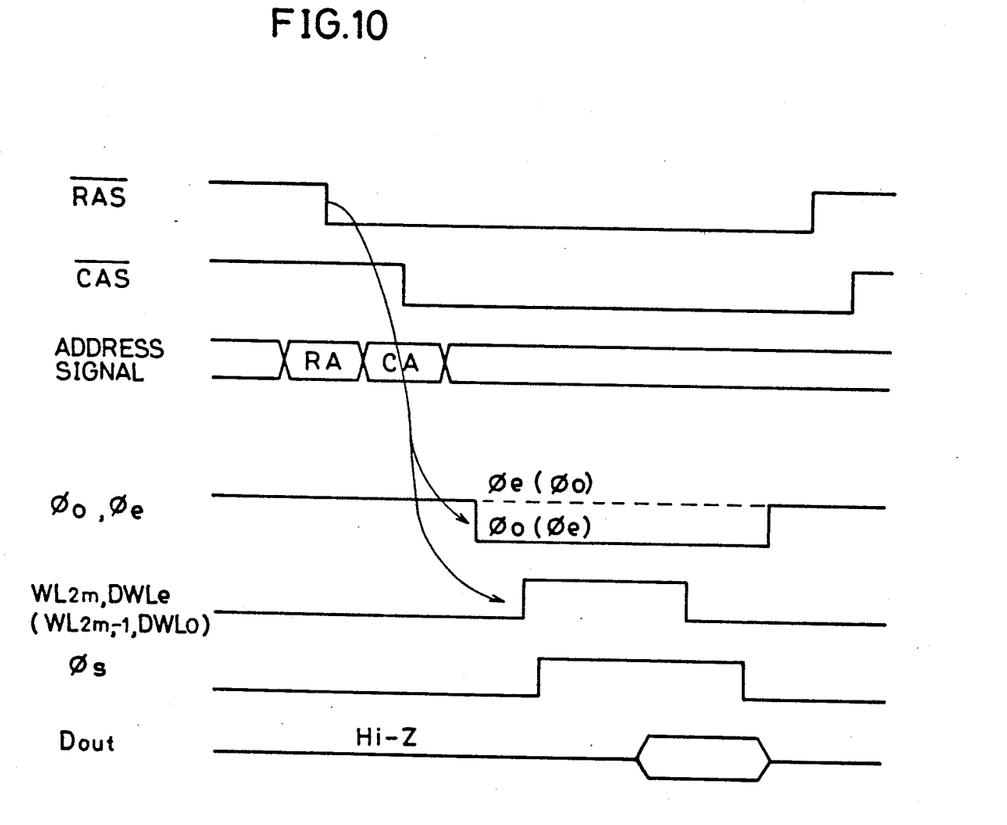
FIG. 10 is a timing chart for explaining a reading operation of a dynamic random access memory according to another embodiment of the present invention.

Meanwhile, as shown in FIG. 9, a dummy bit line DBL receiving a reference potential Vref is arranged outside of the most outside bit line BL.

Although in the above described embodiment, the selecting signals $\phi e$ and $\phi o$ are at the "L" level in advance so that either one thereof attains the "H" level according to the selected word line, selecting signals $\phi e$ and $\phi o$ may be at the "H" level in advance so that the selecting signal $\phi e$ attains the "L" level when a word line $WL_{2m-1}$ is selected while the selecting signal $\phi o$ attains the "L" level when a word line $WL_{2m}$ is selected. However, in this case, the selecting signal $\phi e$ or $\phi o$ must attain the "L" level before the selected word line attains the "H" level. Furthermore, in this case, bit lines are precharged at an equal potential through MOS transistors Te and To, so that an equalize signal $\phi eq$ and MOS transistors Teq for equalizing can be omitted.

Although description was made on a case in which the potential of Vcc/2 is written in the cell capacitance $C_s$ of the dummy cell DC, the structure of the dummy cell DC is not limited to the same.

Additionally, although in the above described embodiment, the odd-numbered word line $WL_{2m-1}$ and the even-numbered word line $WL_{2m}$ are alternately arranged, it is not necessary that they are alternately arranged.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic semiconductor memory device comprising:
   a plurality of word lines,
   a plurality of bit lines arranged intersecting with said plurality of word lines,
   a plurality of memory cells respectively provided at intersections of said plurality of word lines and said plurality of bit lines,
   a plurality of reference potential supplying means each for applying a reference potential to each of said plurality of bit lines,
   a plurality of sense amplifier means each coupled to a corresponding pair of bit lines, having a first bit line onto which information stored in a memory cell is read out and a second bit line to which said reference potential is applied, out of said plurality of bit lines for amplifying a potential difference between said corresponding pair of bit lines, and
   switch means causing each of said plurality of sense amplifier means to be coupled to its corresponding first and second bit lines such that between the first and second bit lines thereof is another bit line onto which information stored in another memory cell is read out.

2. The semiconductor memory device according to claim 1, wherein
   each of said plurality of reference potential supplying means comprises a dummy cell storing said reference potential.

3. The semiconductor memory device according to claim 1, wherein
   said switch means causes said corresponding pair of bit lines to be short-circuited before a reading operation.

4. A dynamic semiconductor memory device comprising:
   a plurality of word lines,
   a plurality of bit lines arranged intersecting with said plurality of word lines,
   a plurality of memory cells respectively provided at intersections of said plurality of word lines and said plurality of bit lines,
   a plurality of reference potential supplying means each for applying a reference potential to each of said plurality of bit lines,
   a plurality of sense amplifier means each coupled to a corresponding pair of bit lines, having a first bit line onto which information stored in memory cells is read out and a second bit line onto which said reference potential is applied, out of said plurality of bit lines for amplifying a potential difference between the first and second bit lines, and switch means causing each of said plurality of sense amplifier means to be coupled to its corresponding pair of bit lines such that between the first and second bit lines, another bit line of the plurality of bit lines to which information stored in other memory cells is read out is adjacent to said first and second bit lines, and outside of said first and second bit lines, other bit lines of said plurality of bit lines onto which said reference potential is applied are respectively adjacent to said first and second bit lines.

5. The semiconductor memory device according to claim 4, wherein each of said plurality of reference potential supplying means comprises a dummy cell storing said reference potential.

6. The semiconductor memory device according to claim 4, wherein
said switch means causes said corresponding pair of bit lines to be short-circuited between a reading operation.

7. A dynamic semiconductor memory device comprising:
a plurality of bit lines,
a plurality of first word lines arranged intersecting with said plurality of bit lines,
a plurality of second word lines arranged intersecting with said plurality of bit lines,
a first dummy word line arranged intersecting with said plurality of bit lines,
a second dummy word line arranged intersecting with said plurality of bit lines,
a plurality of first memory cells respectively provided at intersections of each of said plurality of first lines and 4k-th, (4k+1)-th, (4k+4)-th and (4k+5)-th bit lines out of said plurality of bit lines, where k is an integer of 0 or more,
a plurality of second memory cells respectively provided at intersections of each of said second word lines and (4k+2)-th and (4k+3)-th bit lines out of said plurality of bit lines,
a plurality of first dummy cells respectively provided at intersections of said first dummy word line and the (4k+2)-th and (4k+3)-th bit lines out of said plurality of bit lines,
a plurality of second dummy cells respectively provided at intersections of said second dummy word line and the 4k-th, (4k+1)-th, (4k+4)-th and (4k+5)-th bit lines out of said plurality of bit lines,
a plurality of first sense amplifier means each selectively coupled to a first bit line pair comprising said 4k-th bit line and said (4k+2)-th bit line out of said plurality of bit lines or a second bit line pair comprising said (4k+2)-th bit line and said (4k+4)-th bit line.
a plurality of second sense amplifier means each selectively coupled to a third bit line pair comprising said (4k+3)-th bit line and said (4k+5)-th bit line out of said plurality of bit lines or a fourth bit line pair comprising said (4k+1)-th bit line and said (4k+3)-th bit line,
first selecting means for selecting either one of said plurality of first word lines and said plurality of second word lines,
second selecting means for selecting said first dummy word line when any one of said plurality of first word lines is selected by said first selecting means while selecting said second dummy word line when any one of said plurality of second word lines is selected by said first selecting means, and switch means causing each of said plurality of first sense amplifier means to be coupled to said corresponding first bit line pair when any one of said plurality of first word lines is selected by said first selecting means while causing each of said plurality of second sense amplifier means to be coupled to said corresponding second bit line pair when any one of said plurality of second word lines is selected by said first selecting means.

8. The semiconductor memory device according to claim 7, wherein said switch means comprises
signal generating means for generating a first signal when any one of said plurality of first word lines is selected by said first selecting means while generating a second signal when any one of said plurality of second word lines is selected by said first selecting means,
a plurality of first switching devices coupled between said 4k-th bit line and said corresponding first sense amplifier means and between said (4k+2)-th bit line and said corresponding first sense amplifier means and responsive to said first signal to be rendered conductive,
a plurality of second switching devices coupled between said (4k+2)-th bit line and said corresponding first sense amplifier means and between said (4k+4)-th bit line and said corresponding first sense amplifier means and responsive to said second signal to be rendered conductive,
a plurality of third switching devices coupled between said (4k+3)-th bit line and said corresponding second sense amplifier means and between said (4k+5)-th bit line and said corresponding second sense amplifier means and responsive to said first signal to be rendered conductive, and
a plurality of fourth switching devices coupled between said (4k+1)-th bit line and said corresponding second sense amplifier means and between said (4k+3)-th bit line and said corresponding second sense amplifier means and responsive to said second signal to be rendered conductive.

9. The semiconductor memory device according to claim 7, wherein
each of said plurality of first memory cells and said plurality of second memory cells stores high level information corresponding to a predetermined power-supply potential and low level information corresponding to a ground potential, and
each of said plurality of first dummy cells and said plurality of second dummy cells stores an intermediate potential between said power-supply potential and said ground potential.

10. The semiconductor memory device according to claim 7, which further comprises
column selecting means for selecting any one of said plurality of first sense amplifier means and said plurality of second sense amplifier means.

11. The semiconductor memory device according to claim 10, wherein
said first selecting means comprises a row decoder responsive to an externally applied row address signal for selecting any one of said plurality of first word lines and said plurality of second word lines, and said column selecting means comprises a column decoder responsive to an externally applied column address signal for selecting any one of said plurality of first sense amplifier means and said plurality of second sense amplifier means.

12. An operating method for a dynamic semiconductor memory device comprising a plurality of work lines; a plurality of bit lines arranged intersecting with said plurality of word lines; a plurality of memory cells respectively provided at intersections of said plurality of word lines and said plurality of bit lines; a plurality of reference potential supplying means each for applying a reference potential to each of said plurality of bit lines; and a plurality of sense amplifier means each coupled to a corresponding pair of bit lines, having a first bit line onto which information stored in a memory cell is read out and a second bit line to which said reference potential is applied, of said plurality of bit lines for amplifying a potential difference between the a corresponding pair of bit lines, said operating method comprising the steps of:

coupling each of said plurality of sense amplifier means to its corresponding pair of bit lines such that between said first and second bit lines, another bit line onto which information stored in another memory cell is read out is adjacent to said first and second bit lines, and outside of said first and second bit lines, other bit lines to which said reference potential is applied are adjacent to said first and second bit lines, and amplifying by each of said plurality of sense amplifier means, the potential difference between the corresponding pair of bit lines coupled to the sense amplifier means.

* * * * *